United States Patent [19]
Béranger et al.

[11] Patent Number: 4,942,316
[45] Date of Patent: Jul. 17, 1990

[54] CASCODE LOGIC CIRCUIT INCLUDING A POSITIVE LEVEL SHIFT AT THE INPUT OF THE TOP LOGIC STAGE

[75] Inventors: Hervé Béranger, Fontainebleau; Armand Brunin, Le Mee sur Seine; Bruno Caplier, Mennecy; Jean-Paul Rousseau, Nogent sur Marne, all of France

[73] Assignee: International Business Machines Corporation, Armonk, N.Y.

[21] Appl. No.: 275,860

[22] Filed: Nov. 25, 1988

[30] Foreign Application Priority Data

Oct. 19, 1988 [EP] European Pat. Off. ........ 87480023.8

[51] Int. Cl.$^5$ .......................................... H03K 19/086
[52] U.S. Cl. .................................... 307/455; 307/443; 307/454; 307/475; 307/317.2
[58] Field of Search ............... 307/443, 454, 455, 457, 307/458, 475, 317.2

[56] References Cited

U.S. PATENT DOCUMENTS

| | | | |
|---|---|---|---|
| T957,007 | 4/1977 | Jordan et al. | 307/458 |
| 4,518,876 | 5/1985 | Constantinescu | 307/455 X |
| 4,533,842 | 8/1985 | Yang et al. | 307/455 X |
| 4,547,881 | 10/1985 | Vanadarajan | 307/455 X |
| 4,580,066 | 4/1986 | Berndt | 307/455 X |
| 4,631,427 | 12/1986 | Mazumder et al. | 307/443 X |
| 4,647,799 | 3/1987 | Hsu et al. | 307/455 |
| 4,670,673 | 6/1987 | Vanadarajan | 307/455 |
| 4,845,387 | 7/1989 | Ovens | 307/458 X |

FOREIGN PATENT DOCUMENTS

0176909. 4/1986 European Pat. Off. .
0167339  8/1986 European Pat. Off. .

OTHER PUBLICATIONS

Wescon Technical Papers, 30th Oct.-2nd Nov. 1984, section 31/2, pp. 1-5, Anaheim, Calif., Los Angeles, U.S.; R. Allgeyer: "ECL Gate Array—The High Speed Alternative".
IBM Technical Disclosure Bulletin, vol. 27, No, 4A, Sep. 1984, pp. 2265-2266.
IBM Technical Disclosure Bulletin, vol. 27, No. 1B, Jun. 1984, pp. 681-682.
IBM Technical Disclosure Bulletin, vol. 21, No. 2, Jul. 1978, pp. 562-563.

*Primary Examiner*—David Hudspeth
*Attorney, Agent, or Firm*—Jeffrey L. Brandt

[57] ABSTRACT

A logic circuit family derived from the conventional 2 level single-ended cascode logic circuit. The basic logic circuit performing a 2—2 OA/AI logic function shown in the attached drawing is given for illustration purposes. It comprises: a logic tree 35 comprised of top and bottom stages 37, 36 dotted at the tree output 38 to perform a determined logic function; the top stage 37 includes a current switch comprised of two input transistors TX34, TX35 connected in a differential amplifier configuration with a reference transistor TX36. The bases of input transistors TX34, TX35 are provided with at least two level shifter devices. Preferably, input level shifter devices are Schottky diodes P31, ... which move the voltages towards the more positive voltage VPP, to add an AND function on each of these input transistors.

7 Claims, 4 Drawing Sheets

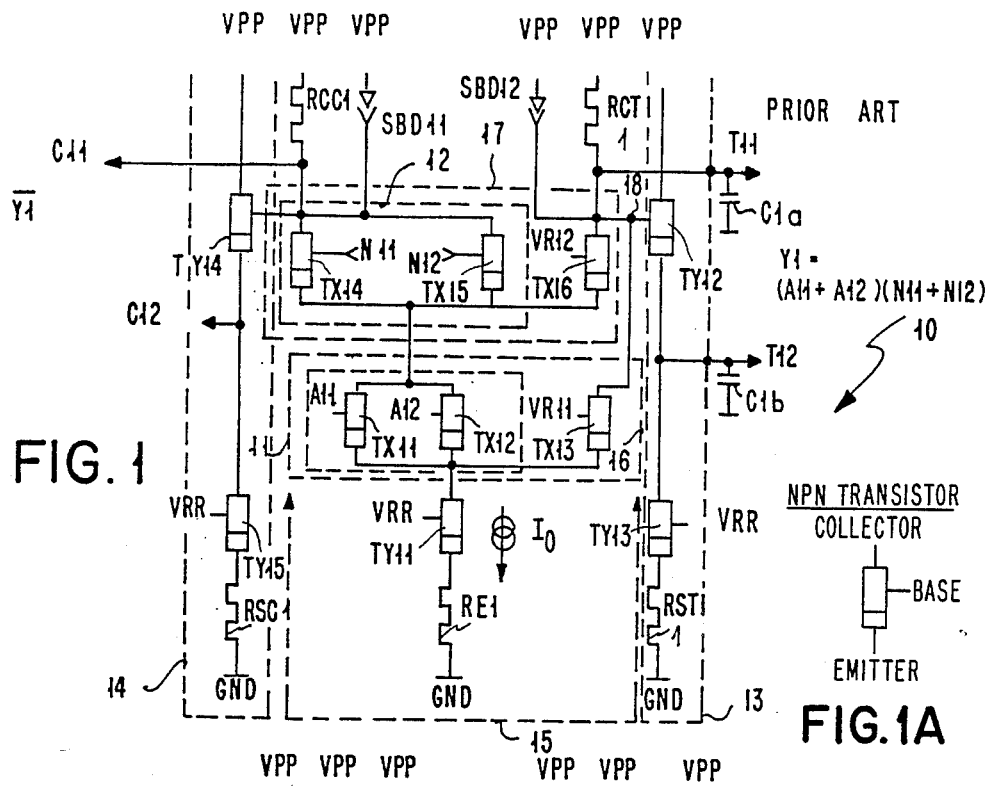
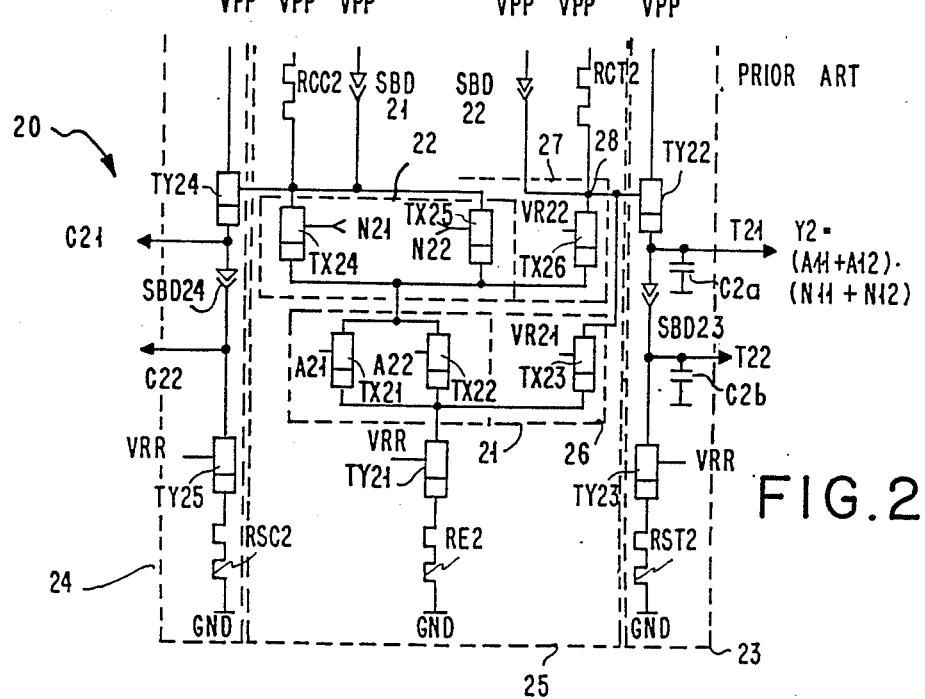

$$Y3 = \overline{((P31 \cdot P32 \cdot P33) + (Q31 \cdot Q32)) \cdot (A31 + A32))}$$

CASCODE LOGIC CIRCUIT INCLUDING A POSITIVE LEVEL SHIFT AT THE INPUT OF THE TOP LOGIC STAGE

The present invention relates generally to logic circuit networks and more particularly to powerful combinational 2 N high cascoding logic tree networks with embedded supplemental logic functions capable of processing complex Boolean logic functions.

BACKGROUND OF THE INVENTION

The cascode logic family is derived from the well known Emitter Coupled Logic (ECL) family, which is characterized by a systematic usage of non-saturated transistors, which, in turn, results in very high speed performances.

Given the obvious power of the Emitter Coupled Logic technology, the cascode logic technology is the ideal VLSI candidate for being implemented in high end computers. It has potentially superior power-performance attributes compared to other logic circuit technologies. Further, this technology may be integrated in low cost bipolar chips compatible with a CMOS environment. However, it also has some drawbacks which have prevented it from becoming a generalized logic technology to date.

Two-level single-ended cascode (2L-SE) circuits are well-known in the art. These two levels are generally called bottom stage and top stage levels because of the DC voltages that the signals must respect. There are two types of 2L-SE cascode circuits depending on either collector output usage or systematic emitter follower usage. These two types of 2L-SE cascode circuits are depicted respectively in FIGS. 1 and 2.

A conventional 2L-SE cascode circuit with NPN transistors and collector output usage is shown in FIG. 1. Basically, the circuit 10 of FIG. 1 is made of two sets of current switches 11 and 12 mounted in cascode and of one translator stage per output, respectively referenced 13 for the true output and 14 for the complement output. Circuit 10 is biased between a first supply voltage, a positive voltage VPP, and a second supply voltage, the ground GND.

The first set 11 of current switches is comprised of input transistors TX11 and TX12, connected in a differential amplifier configuration with reference transistor TX13. Combination of current switch 11 and transistor TX13 forms the so called "bottom stage" 16. The base of transistor TX 13 is connected to a fixed reference voltage VR11 delivered by a reference voltage generator. The bottom logic input signals, A11 and A12, are applied to the bases of transistors TX11 and TX12, respectively. The bottom stage is supplied by a constant current IO, determined by a conventional current source comprised of transistor TY11, the base of which is connected to a fixed reference voltage VRR delivered by a reference voltage generator, and resistor RE1. Said constant current IO=((VRR VBE(TY11))/RE1) has to flow either through TX11,TX12 or TX13; it flows through the transistor which receives the highest base voltage. Since in this example, collectors of TX11 and TX12 are tied together, the collector voltage may go low as soon as the current flows through TX11 or TX12, thus realizing a 2 Way OR function. Note that the extension to an N Way OR is trivial.

The second set 12 of current switches is comprised of input transistors TX14 and TX15 connected to a differential amplifier configuration with transistor TX16. The combination of current switch 12 and transistor TX16 forms the so called "top stage" 17. The base of transistor TX16 is connected to a fixed reference voltage VR12 delivered by a reference voltage generator. The top logic input signals N11 and N12 are applied to the bases of transistors TX14 and TX15, respectively. The constant current is determined by the same current source as for the first set of current switches. It still flows through the transistor which receives the highest base voltage. Since in this example, TX14 and TX15 collectors are tied together, the collector voltage may be low as soon as the current flows through TX14 and TX15, realizing a 2 Way OR function. Note that the extension to an N Way OR is trivial.

Current switches 11 and 12 are loaded with a conventional resistor RCC1 mounted in parallel with a Schottky Barrier Diode (SBD) referenced SBD11. These devices are necessary to compensate variations of reference voltage VRR, which could be detrimental to the operation of the circuit at a low output logical level. Collectors of transistors TX13 and TX16 are dotted at node 18 and loaded with resistor RCT1 mounted in parallel with diode SBD12.

Bottom stage 16 and top stage 17, the loads (RCC1, SBD11, RCT1 and SBD12), and the associated current source circuitry (TY11 and RE1), form the tree 15, biased between VPP and GND. The true output T11 of the tree is available at node 18 formed by dotting collectors of transistors TX13 and TX16. The complement output C11 is available at the node where collectors of TX14 and TX15 are tied together.

Each one of the true and complement outputs receives a level translator or output stage respectively referenced 13 and 14. Level translator stage 14 for the true output is constituted with transistor TY12 mounted as an emitter follower and a current source comprised of TY13 and resistor RST1. The top output T11 is available at collector of TX16 while the bottom output T12 is available on the emitter of TY12. Similarly, level translator stage 14 for complement output is comprised of devices TY14, TY15 and TSC1. The top output C11 is available at the collector of TX14 while the bottom output C12 is available on the emitter of TY14. Either translator stage 13 or 14 also acts as a buffer for 'bottom' connections.

In summary, circuit 10 may be broadly understood as being comprised of two stacking levels, the first including TX11, TX12 and TX13 forming the bottom stage and the second including TX14, TX15 and TX16 forming the top stage. Only the bottom stage is provided with a buffer stage.

The constant current source IO sets the power that the logic tree 15 will consume in performing its designed logical function. Logical operations are accomplished by selectively steering the tree current through various paths within the tree to one of two binary output summation points. Current steering is accomplished by applying logic input signals to each input of transistors in the tree, selecting the transistors that will allow the current to pass. Both sets of current switches in this example are connected so that, to get a low voltage at RCC1 resistance node, and thus a high voltage corresponding to a logical "1" at RCT1 resistance node, the current has to flow through TX14 or TX15 AND through TX11 OR TX12. The logic function is therefore an AND of the two ORs. The logical Boolean function Y1 available at output T11 is Y1=(A11+A12)

(N11+N12). The complementary function $\overline{Y1}$ is available at output C11.

Other functions like extended ORs, exclusive ORs, etc. may also be obtained by changing the connections from the first to the second set of current switches.

An important drawback of circuit 10 results from its excessive sensitivity to the capacitive loading at the top output. For example, line and wiring capacitance C1a at top output T11, has a significant impact in terms of delay (time constant), which, in turn, limits the switching speed of the cascode circuit. Therefore, this sensitivity is a serious detractor in terms of circuit performance. Circuit 10 is also sensitive to dotting in terms of delay, as any dotting will bring additional capacitances.

An improved alternative to the circuit of FIG. 1 is shown in FIG. 2 where similar devices bear corresponding references. Circuit 20 differs from circuit 10 only in the configuration of level translator stages 23 and 24. Unlike in circuit 10, the top output T21 of translator stage 23 is translated downward a VBE, through translator TY22 connected in an emitter follower configuration. As a result of this downshift, circuit 20 benefits from the buffering effect offered by transistor TY22. The bottom output T22 is translated even more by means of an output level shifter: either a PN junction (a transistor operating as a diode) or a Schottky junction. To avoid bottom stage transistor saturation in the tree, a minimum shift of 0.4 V is needed. The Schottky Barrier Diode offers a shift of 0.55 V which is convenient. On the other hand, the PN diode offers a shift of about 0.8 V which is also appropriate, but does have the inconvenience of requiring a higher VPP supply for correct functional operation.

The circuit has a much better performance-power product than the circuit of FIG. 1. The tree current is lower, as the tree performs only the logic function without any load at the tree output. In addition, TY22 and its associated current source TY23 take care of the load (wiring capacitance C2a and fan-out) at top output T21.

However, the cascode circuit 20 of FIG. 2 still presents various inconveniences, mainly caused by the presence of the output level shifters such as the SBDs.

First of all, it needs two outputs per phase out, e.g. T21 and T22 for translator stage 23. Because the second output T22 is shifted down from the emitter output, through SBD23, this shift causes circuit 20 to be non-functional below VPP=3.2 V (worst case voltage to be applied at the circuit itself after off-chip and on-chip supply voltage drops and tolerance).

As a first consequence, circuit 20 is not usable with the 3.3±0.3 V VPP supply as defined by the JEDEC specifications for future CMOS products and CMOS/bipolar interfaces in the worst case conditions, where the supply voltage VPP is as low as 3 V.

As a second consequence, the top output, (e.g. T21) may be connected only to corresponding top input signals e.g. N21, N22,. . .) but not to the bottom input signals (e.g. A21, A22,. . .), of a following similar circuit, since transistors like TX21, TX22, and TX23, would saturate. Conversely, bottom output, e.g. T22 may be connected only to corresponding bottom input signals e.g. A21, A22, etc. . ., but not to the top input signals e.g. N21, N22, etc..., of a following similar circuit.

In addition, the implementation of FIG. 2 which includes two outputs per phase out, not only requires more wiring which in turn, results in lower density, but also implies two load capacitances, e.g. C2a and C2b, which are almost in parallel, because they are connected through said output level shifter which consists of a continuously conducting diode, e.g. SBD23, when the two outputs are simultaneously used.

The circuit of FIG. 2 must also use Schottky Barrier Diodes, referenced as SBD21 and SBD22, as clamping devices across collector resistors respectively referenced RCC2 and RCT2. The intent is to provide both a good definition of the voltage swing which cannot be minimized and to avoid saturation of the top output transistors such as TX24 and TX25; this may occur if the current source has wide variations due to process, temperature and power supply tolerances. In addition, said clamping devices add to the collector parasitic capacitance. As a result, the presence of these clamping devices significantly impedes the speed of the cascode circuit.

Further, a library of logic circuits based on the circuit shown in FIG. 2 would have two major inconveniences. First, it would have potentially a low power from a logical implementation point of view. The circuit of FIG. 2 provides an OR-AND function; if more complex functions are needed, appropriate standard logic circuitry has to be added, at the cost of significantly lowering integration density. Secondly, the circuit shown in FIG. 2 exhibits a limited number of logical circuits, in that it does not allow generalization to 2N-level single-ended cascode logic circuits, unless the power supply value is significantly increased, which is not the trend in designing future VLSI circuits. The primary objective of the present invention is therefore to provide a family of cascode current switch logic circuits forming a library of various logic functions which do not have the above mentioned drawbacks inherent in the conventional cascode circuits with output level shifter.

OBJECTS OF THE INVENTION

It is an object of the present invention to provide a library of cascode current switch logic circuits, functional down to a positive supply voltage level compatible with future CMOS products and CMOS/bipolar interfaces in the worst case conditions.

It is another object of the present invention to provide a library of cascode current switch logic circuits having single output per phase instead of two (top and bottom), for increased densities and reduced loading capacitances.

It is another object of the present invention to provide a library of cascode current switch logic circuits wherein the use of an output level shifter such as a SBD, to shift down the bottom level with respect of the top level, is no longer necessary.

It is another object of the present invention to provide a library of cascode current switch logic circuits without clamping devices in the loads, to get reduced voltage swing and improved speed.

It is still another object of the present invention to provide a library of cascode current switch logic circuits wherein complex logic functions may be implemented at a very low cost, by adding a supplementary "AND" logic level on the logic inputs.

It is still another object of the present invention to provide a library of cascode current switch logic circuits with better power-performance product as measured on complex logic functions.

It is still another object of the present invention to provide a library of cascode current switch logic circuits having stacking capabilities in the cascode logic tree, to reach 2N level cascoding logic tree networks.

SUMMARY OF THE INVENTION

To this end, a new and improved logic circuit family is provided wherein the circuits are provided with the bottom output only. This means that an emitter follower (EF) configuration is systematically used, and for a given phase out, only one wire is single wire means a better density and also a lower loading capacitance. In addition, in the translator stage, the output level shifter device, e.g. a SBD, which down shifts the bottom level with respect to the top level, is no longer necessary.

In accordance with the present invention, the top stage level is recovered in each circuit input by means of at least one level shifter device (translator), such as a diode, connected to the input transistors. This diode usage enables the addition of an AND logic function on the inputs when several diodes, whose anodes are connected together, are used. It is a key feature of the present invention to employ unidirectional current conducting means, such as diodes, as inputs to add an AND logic function in a cascode logic circuit.

In addition, to obtain better speeds, the voltage swing has been reduced and it is no longer necessary to place any clamp device on the collectors of the load transistors illustrated in FIGS. 1 and 2.

As a result, the type of logic functions that are basically associated with a cascode tree of the present invention are an AND (or an OR) of:
AND-OR at top stage level;
OR at bottom stage level.
Lastly, the present family of circuits may be operated either from a 3.3 or from a 5.0 V nominal power supply, or any power supply insuring 3 V minimum at the circuit itself, in the worst case.

The above concept may be generalized to the implementation of a family of 2N-level single-ended (2NL-SE) cascode logic circuits.

The novel features believed to be characteristic of this invention are set forth in the appended claims. The invention itself, however, as well as other objects and advantages thereof, may best be understood by reference to the following detailed description of illustrated embodiments, read in conjunction with the accompanying drawings.

BRIEF DESCRIPTION OF THE DRAWINGS

FIG. 1 shows a conventional two level single-ended (2L-SE) cascode circuit of the prior art performing an OR-AND logic function on the true output with collector output usage.

FIG. 1A is a legend illustrating the schematic depiction of an NPN transistor as used in the FIGS. illustrating the present invention.

FIG. 2 shows a conventional two level single-ended (2L-SE) cascode circuit of the prior art performing an OR-AND logic function on the true output with systematic emitter follower usage.

DETAILED DESCRIPTION OF THE INVENTION

We will describe first the principles of a new family of cascode current switch logic circuits with the example of a basic circuit performing an OR-AND logic function. Then we will show a few examples of the circuits pertaining to the library of logic circuits which can be derived therefrom.

Figure 3:
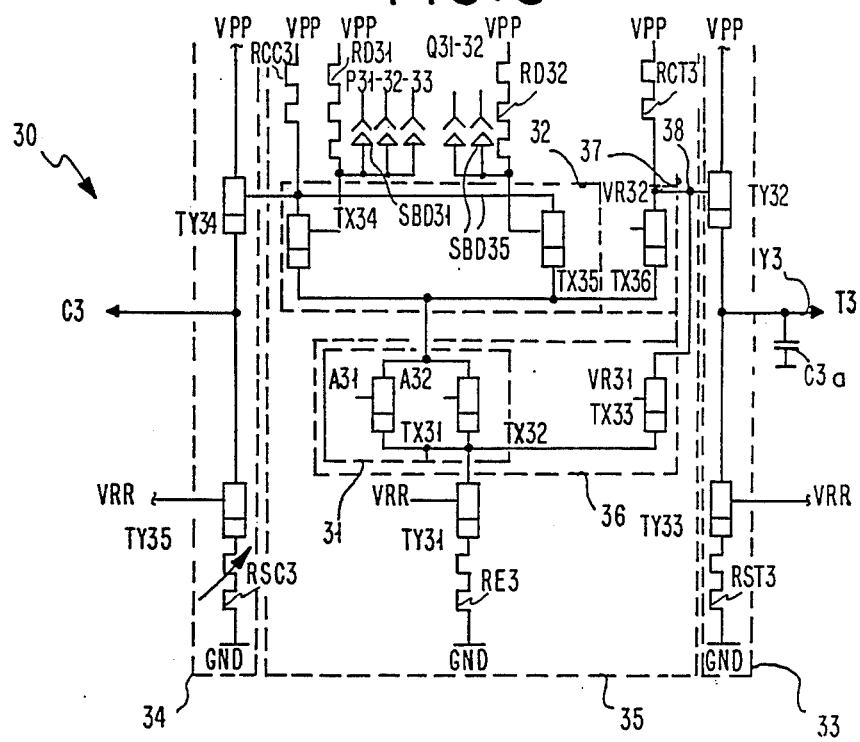
FIG. 3 shows a novel logic circuit performing a 2—2 OA/OAI logic function with one 3 way AND and one 2 way AND on the input transistors according to the teachings of the present invention.

The basic principles of this new family of CSC circuits can be understood from the teachings of the basic circuit 30 shown in FIG. 3 which performs an elementary Boolean function. Circuit 30 will be used in order to illustrate the features and operation of the circuits of the present invention. However, it is to be noted that the present invention is not limited to this particular configuration. Circuit 30 of FIG. 3 is in some respects similar to circuit 20 of FIG. 2 to take full benefit of the systematic usage of an emitter-follower from a performance product. Circuit 30 includes two sets of current switches 31 and 32 mounted in a cascode configuration, and one translator or output stage per output, respectively referenced 33 for the true output and 34 for the complement output. Output circuits for the "true" and "complement" output are mounted in an emitter-follower configuration, in order to adjust the logical levels and to amplify the current. Each output includes a current source, the value of which is selected according to the load, the dotting, and fan-out it will drive. Circuit 30 is biased between the first supply voltage: a positive voltage VPP, and a second supply voltage: the ground GND. Current switch 31 is comprised of input transistors TX31 and TX32 connected in a differential amplifier configuration with reference transistor TX33, to form the bottom stage 36. Similar construction applies to transistors TX34, TX35, TX36, respectively, to form top stage 37. As previously explained with respect to FIG. 2, bottom stage 36 and top stage 37, the loads (RCC3, RD31, RD32 and RCT3) and the associated current source circuitry (TY31, RE3) form the tree 35 biased between VPP and GND. Collectors of reference transistors TX33 and TX36 are dotted at node 38 where the tree output is available.

The reader's attention is drawn now to the significant differences between the top stage 37 of FIG. 3 and the top stage 12 of FIG. 2. Specifically, the down shift implemented in the output through diode SBD23 in circuit 20 of FIG. 2 is replaced with an upward shift in the input transistors through level shifter devices: either Schottky Barrier or PN diodes. This upward shift is a major feature of the present invention. In circuit 20, the base of TX24 is connected to input signal N21; in circuit 30, the base of the corresponding input transistor TX34 is connected to a logic circuit comprised of a plurality of PN or Schottky diodes. if one or two diodes are used, SBD's may be preferred due to the beneficial anode to cathode capacitance by which the switched input is coupled to the transistor base. If three or more diodes are used, PN diodes are preferred; otherwise, the unswitched Schottky anode to cathode capacitances would become dominant and would have to be charged or discharged. SBD's referenced SBD31 to SBD33 and resistor RD31 are combined to perform an AND function and are connected to the base of input transistor TX34. SBD's 34 and 35 and resistor RD32 are also combined to perform an AND function and are connected to input transistor TX35.

To summarize, the type of logic functions that are basically associated with a simple cascode tree are an AND (or an OR) or an AND-OR at top stage level, combined with an OR at bottom stage level.

In a manner well known to those ordinarily skilled in the art, a Schottky contact is commonly fabricated by reacting a metal of the platinum group (Pt, Pd, . . .) with the N- epitaxial layer of a silicon substrate when a high barrier diode which exhibits a high forward voltage characteristic (e.g. 500—600 mv) is desired. For example, the technique disclosed in the published European patent application No. 65133, assigned to the assignee of the present invention, is appropriate. Preferably SBD's with high potential barrier are used, for a better distinction in input voltage levels and to avoid bottom transistor saturation. The reference voltage VR32 is obtained by shifting up the reference voltage VR31 through a similar SBD. This is required in order to have distinct reference voltages to supply top and bottom stages. Cathodes of said diodes are connected to logical input signals P31 to P33. Bottom and top stages, respectively referenced 36 and 37, are different in that, inputs of the top stage are shifted a value of about 0.6 V because of the presence of SBD's 31 to 35. This particular structure explains the "Cascode" terminology. On the other hand, the current switching in the tree is achieved for very low voltage swings on the base of the input transistors of either the top or bottom stage, which explains the terminology of "current switch". By dotting several diodes together, an AND function is realized on each input transistor of the top stage. This is achieved by connecting the common anodes of an AND logic circuit to the base of an input transistor as explained above. In addition, clamping devices: SBD's 21 and 22, useful in circuit 20 of FIG. 2, are no longer necessary. Finally, the logic voltage swing is kept to a minimum to improve the delays. This leads to the use of less than 600 mV (500 to 580 mV range, in practice) voltage swing, which shows that even a standard Schottky diode would not be of utility to define this voltage swing, and would also add parasitic capacitances and associated time delay. Thus, the invention uses a voltage swing which is defined by the tree current source and the collector resistances. In practice, this requires a highly accurate VRR reference generator.

From a functional standpoint, the advantages of the present invention are set out below.

1. Functionality can be assured down to 2.8 V minimum power supply at circuit level (the description hereafter shows a library adjusted for a 3 V minimum operation). The family may be operated from power supply values above this value, as well. For example, it can be operated from a 5 V power supply, however, it is to be noted that power dissipation is proportional to the power supply value.

2. Coupling several diodes as shown in FIG. 3, an AND function is added for each top input, which increases the complexity of permitted logic functions. The tree bottom performs a 2 Way OR. The tree top performs a 2Way OR each input of which is preceded by an AND. Present implementation shown in FIG. 3 is a 3 Way SBD AND, 2 Way OR at tree bottom, 2Way OR at tree top, 3 Way dotting at Circuit outputs. While in the circuit of FIG. 3 there is described an AND function between the top stage (which provides by itself an AND-OR function), and the bottom stage (which provides by itself an OR function). It must be understood that an OR function might be easily implemented as well. Furthermore, it must also be understood that both the bottom and top stages may be so implemented and connected to provide more complex logic functions compared with conventional cascode circuits.

Although the shown embodiments refer to 2-level cascode circuits, the extension to 4-level, 6-level or 2N-level cascodes is feasible, to create more complex functions, on top of the basic 2-level cascode novel circuit advantages. On the 4-level cascode possible embodiment according to the invention, 2 further levels may be obtained on a single output, driven from a shifted down output (for example, by means of two SBD's in series in the emitter follower). Note that there is a 0.6 V (one SBD forward voltage VF) gain on minimum power supply that would be required with conventional 2N-level cascodes of FIG. 2.

3. Density is improved, due to the implementation of more complex functions per book or macro on the one hand, and due to the fact that one output per phase instead of two, must be wired to other books on the other hand. The single wire output is of key interest in terms of reducing design system complexity.

4. Because the clamping devices across tree collector resistances of FIG. 2 are no longer used, parasitic capacitances are significantly decreased. In addition, the voltage swing is reduced to speed up the performances. This voltage swing is compatible with a set of logic rules describing the maximum fan-in, fan-out and dotting of a particular book.

The voltage swing and the current sources are related to VBE forward voltage of transistors. The voltage swing is around 0.76 VBE.

Figure 4:
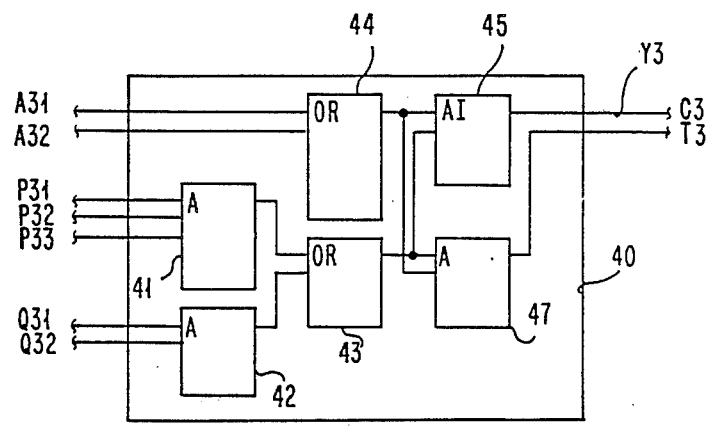
FIG. 4 shows the logic implementation of the circuit of FIG. 3.

5. The power-performance product is improved. It is difficult to evaluate this benefit, as it depends on the type of logic which is implemented. The book delay must be compared to the delay that would be obtained with other logic families. Here, we only want to compare with the closest existing cascode family known to the applicant, a typical example of which is shown in FIG. 2, quoting a figure of 1.3 AI equivalent delay. It is submitted that the present invention provides more than 2 AIs equivalent per book in terms of delays. An example is shown in FIG. 4, from input signal P31 to output signal T3. Note that many paths in FIG. 4 show 3 AI delays from the book input to the book output. With the same delay, technology of FIG. 2 allows 1.3 AI equivalent while with the present principles, it is allowed 2.2 AI's statistically.

Another significant advantage in terms of delays is due to the single output wire, which means that the load capacitance is divided by 2 for all nets that would need to feed both bottom and top input types (this is the majority of nets). In terms of power, with respect to the prior art circuit shown in FIG. 2, there is proposed a figure of three AI's equivalent (2 way AIs average that would be needed to replace one of their books). For the FIG. 3 library type, a figure of 3.8 (2 Way AI) is statistically given. Emitter follower dotting is allowed for the invention, which increases the book library capability.

Globally, in terms of power performance product, improvement compared to circuit 20, FIG. 2 for a 2 way AI.

6. In practice, several speeds may be chosen for each book. The tree current is changed for each speed. The emitter follower current is changed not only as a function of the chosen book speed, but also as a function of the DC loading (fanout), and of the AC loading (net wiring capacitance).

All library books or macros may be derived from these basic principles.

Figure 5:
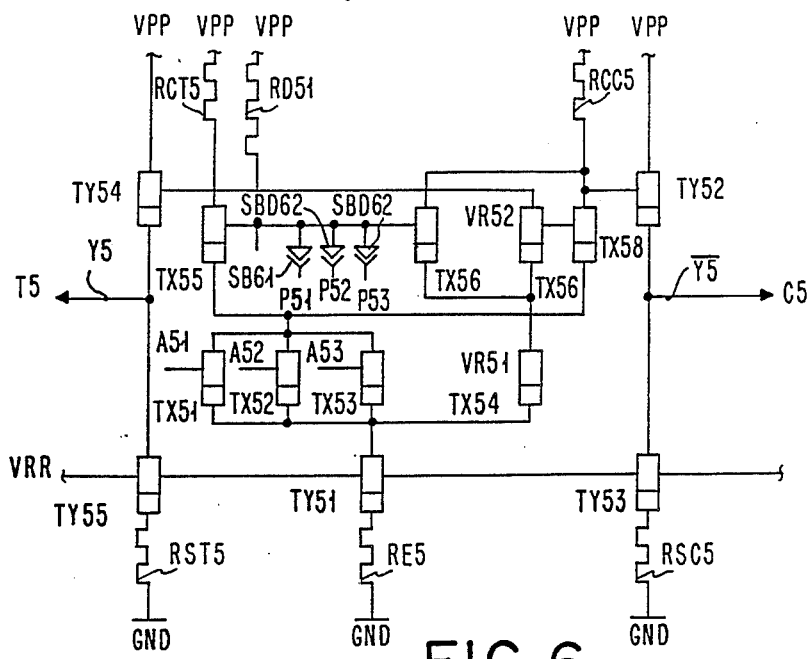
FIG. 5 shows a 2 Way Exclusive OR according to the teachings of the present invention.

For example, a 2 Way Exclusive OR extended with a 3 way AND and a 3 way OR is shown in FIG. 5, which function is:

Y5=((A51+A52+A53) * −(P51*P52*P53)) +

(−(A51+A52+A53) * (P51*P52*P53))

Figure 6:
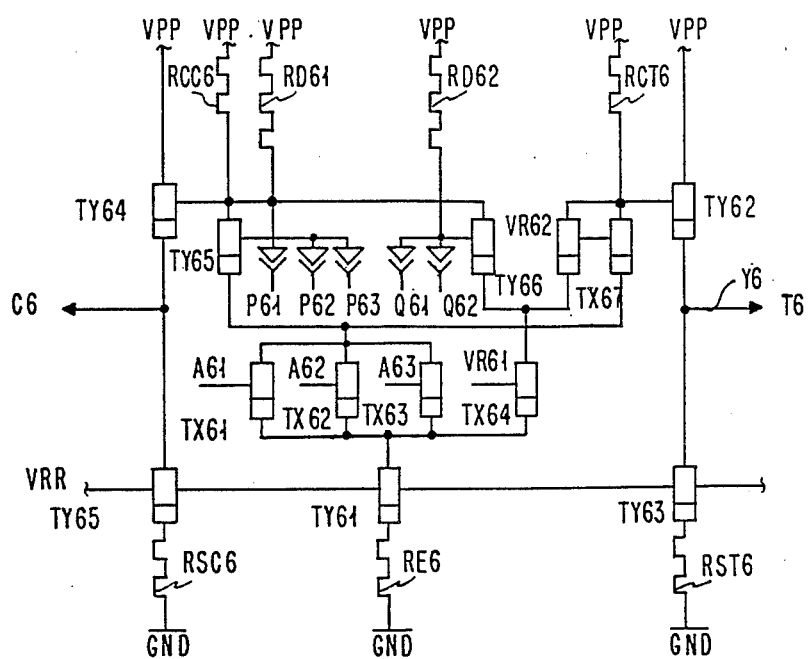
FIG. 6 shows a 2 Way Selector according to the teachings of the present invention.

Another example is a 2 Way Selector extended with a 3 way AND and a 2 way AND as shown in FIG. 6.

Figure 7:
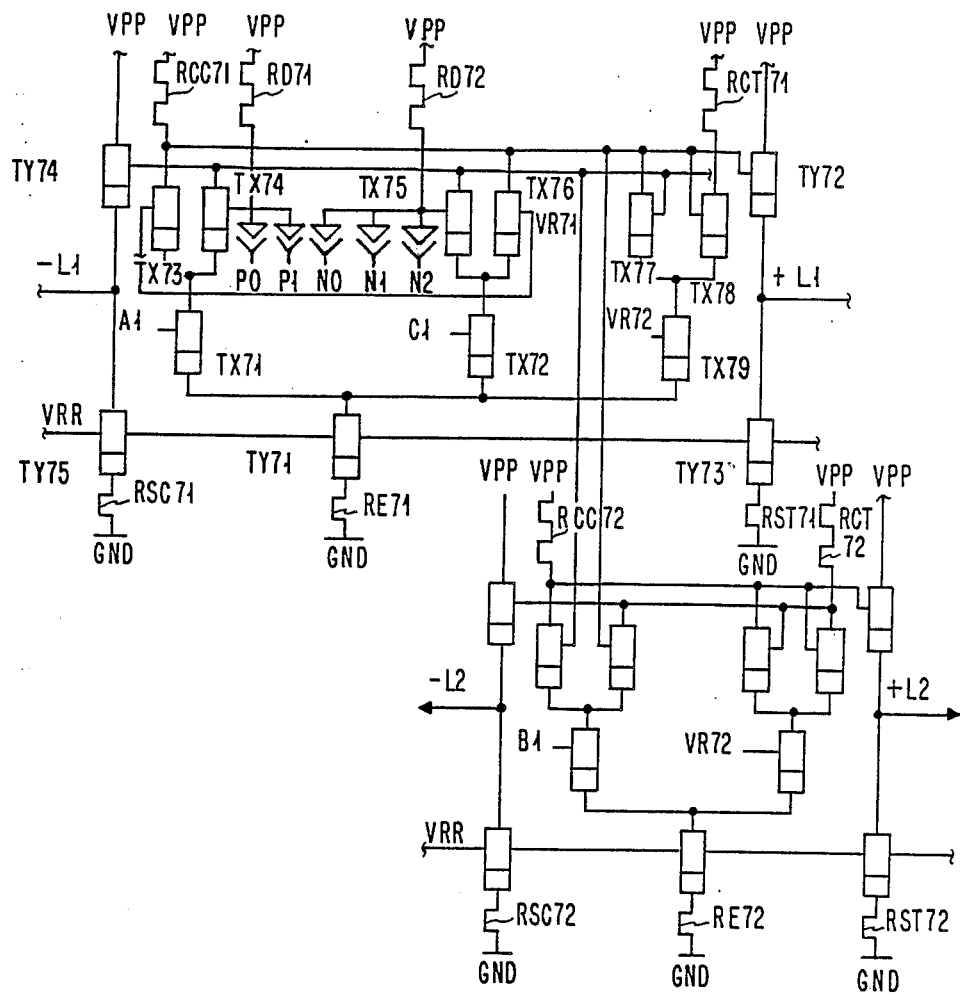
FIG. 7 shows a 1 port Polarity Hold Latch teachings of the present invention.

Still another example is given in FIG. 7, which displays the schematic for a 1 port Polarity Hold Shift Register Latch (PHSRL) implemented according to the LSSD technique. TX77 and TX78 are the cross-coupled transistors of the master. The data N0, N1 and N2 are master at the time when the C clock is active. The slave inputs are directly tied to the collectors of TX77 and TX78. This means that the master loading at the emitter-follower does not delay the transmission to the slave. Note also that the master latching time does not depend on the master loading. Another advantage of this schematic is that the master outputs (at emitter follower outputs) may be dotted, which is not a general case for latches.

Another interesting feature consists in that this PHSRL may be clock driven from any book of the library, it does not require a specific clock driver book.

There is no difficulty in extending further the logic that can be incorporated into the latches of this family. An AND-OR logic function on a data path might be included as associated to the C1 clock. This function would be included into the latch at no power expense and at a very small performance penalty. A 3 port SRL with logic extension on data path, and ORing extension on clock path is achievable with present library design.

What is claimed is:

1. In a 2N level single-ended cascode logic circuit biased between a first supply voltage and a second supply voltage, wherein N is a positive integer greater than zero, said logic circuit of the type including a logic tree including at least two stacking levels connected in a cascode configuration comprised of top and bottom stages having outputs that are dot-connected to perform predetermined logic function at the tree output;

at least one output circuit comprised of an emitter-follower transistor which is driven by the signal at said tree output;

wherein each stage includes a current switch each being comprised of at least one input transistor connected in a differential amplifier configuration with a reference transistor;

wherein said bottom stage provides a logical OR function;

apparatus comprising:

at least one input transistor of at least one of said top stages having its input coupled to level shift means for providing a positive voltage shift to an input signal applied thereto.

2. A 2N level single-ended cascode logic circuit according to claim 1 wherein said level shift means includes means for providing an AND logic function for multiple input signals applied at the input to said at least one input transistor.

3. A 2N level single-ended cascode logic circuit according to claim 1 wherein said level shift means are selected from the group consisting of PN or Schottky diodes.

4. A 2N level single-ended cascode logic circuit according to claim 1 wherein said level shift means includes Schottky Barrier Diodes whose anodes are connected together and to a load resistor.

5. A 2N level single-ended cascode logic circuit according to claim 1 wherein said output circuit includes a single output available on the emitter of said emitter follower transistor, said single output capable of driving both the top and bottom stage inputs of another 2N level single ended cascode logic circuit.

6. A 2N level single-ended cascode logic circuit according to claim 1 wherein the input and reference transistors of the top stage are connected to purely resistive loads.

7. A 2N level single-ended cascode logic circuit according to claim 1 wherein said predetermined logic function is either an OR or an AND logic function.

* * * * *

UNITED STATES PATENT AND TRADEMARK OFFICE
CERTIFICATE OF CORRECTION

PATENT NO. : 4,942,316

DATED : July 17, 1990

INVENTOR(S) : H. Beranger, A. Brunin, B. Caplier, J-P Rousseau

It is certified that error appears in the above-identified patent and that said Letters Patent is hereby corrected as shown below:

Column 9, line 19 should read --
are ANDed in this book before being transferred to the master at the time when the C clock is active. The --.

Signed and Sealed this

Sixteenth Day of June, 1992

Attest:

DOUGLAS B. COMER

Attesting Officer

Acting Commissioner of Patents and Trademarks